US007977033B2

(12) United States Patent
Kim

(10) Patent No.: US 7,977,033 B2
(45) Date of Patent: Jul. 12, 2011

(54) METHOD OF FORMING PATTERN OF SEMICONDUCTOR DEVICE

(75) Inventor: Sang Min Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 783 days.

(21) Appl. No.: 11/965,277

(22) Filed: Dec. 27, 2007

(65) Prior Publication Data

US 2008/0280232 A1 Nov. 13, 2008

(30) Foreign Application Priority Data

May 7, 2007 (KR) .......................... 10-2007-0044109

(51) Int. Cl.
*G03F 7/26* (2006.01)
(52) U.S. Cl. ........................................ 430/311; 430/330
(58) Field of Classification Search .................. 430/311, 430/5, 330, 396
See application file for complete search history.

(56) References Cited

U.S. PATENT DOCUMENTS

2005/0008942 A1  1/2005 Cheng et al.

FOREIGN PATENT DOCUMENTS

WO   2006109907   * 10/2006

* cited by examiner

*Primary Examiner* — Kathleen Duda
(74) *Attorney, Agent, or Firm* — Kilpatrick Townsend & Stockton LLP

(57) ABSTRACT

The present invention relates to a method of forming a pattern of a semiconductor device. According to the method in accordance with an aspect of the present invention, a photoresist film is formed on a semiconductor substrate. An exposure process is performed on a plurality of light transparent patterns arranged in tandem and the photoresist film corresponding between the light transparent patterns using a photomask including the light transparent patterns. A photoresist pattern is formed by performing a development process so that an opening portion of a line form is formed in the light transparent patterns and the photoresist film between the light transparent patterns. Accordingly, a uniform line pattern can be formed.

6 Claims, 4 Drawing Sheets

METHOD OF FORMING PATTERN OF SEMICONDUCTOR DEVICE

CROSS-REFERENCES TO RELATED APPLICATIONS

The present application claims priority to Korean patent application number 10-2007-44109, filed on May 7, 2007, which is incorporated by reference in its entirety.

BACKGROUND OF THE INVENTION

The present invention relates to a method of forming a pattern of a semiconductor device and, more particularly, to a method of forming a pattern with a uniform line pattern.

In a typical pattern formation process of a semiconductor device, a photoresist pattern is formed over layers to be patterned, such as a silicon layer, an insulating layer and/or a conductive layer, using a photolithography process. The layers are etched using the photoresist pattern as an etch mask, thus forming a desired pattern.

In this photolithography process, the photoresist is first uniformly formed on a wafer using a spin method. The term "photoresist" is a type of photosensitive polymer that undergoes a photo exposure reaction when being exposed to light of a specific wavelength band. The term "exposure reaction" refers to the polymer chains of an exposed portion of the photoresist being broken or further bonded when exposed to light. In general, a photoresist is classified into a positive photoresist in which a polymer bonding chain of an exposed portion is broken and a negative photoresist in which a polymer bonding chain of an unexposed portion is broken. That is, the positive photoresist has its exposure region developed through a subsequent development process, so a pattern of a non-exposure region remains. The negative photoresist has its non-exposure region developed, so a pattern of an exposure region remains.

A solvent of about 80% to 90% existing in the photoresist is evaporated using thermal energy by performing a soft bake, thus drying a photoresist film. Thus, adhesion is improved and stress is reduced by an annealing process.

A latent image of a desired pattern is formed on a surface of the photoresist by performing an exposure process in order to selectively generate a photochemical reaction of the photoresist though exposure energy. In the exposure process, a desired latent image is formed by selectively irradiating the photoresist with a light source by employing the photomask in which a light-shield pattern and a light transparent pattern are formed. The wafer on which the latent image of a desired pattern is formed is inserted into a hot plate oven and then exposed for about 90 seconds. A Post Exposure Bake (PEB) process is then carried out. The photoresist of a portion where bonding has relatively become weak through the exposure process is dissolved in the solvent. A shape of the photoresist formed through this process is called a photoresist pattern. At this time, a portion where bonding is relatively weak (an unexposed portion), of the polymer chain untied by the photosensitive action in the positive photoresist, compared with a portion of the negative photoresist where bonding becomes strong by the photosensitive action, is removed. Meanwhile, there is a chemical amplification type photoresist for forming a complete photoresist pattern by generating acid within the photoresist during an exposure process by employing a difference in the concentration of a photo sensitizer due to a mutual interference phenomenon between incident light and reflected light and then making the acid function as a catalysis by thermal energy obtained in a PEB process in order to selectively remove the photoresist through a chemical amplification action.

However, as semiconductor devices become more highly integrated, a design rule with a smaller Critical Dimension (CD) is used. Thus, there is a need for a technology for forming a contact hole having a small opening size or a micro pattern having a small width. Accordingly, it is an important issue to form a micro photoresist pattern without defects when a photolithography process is performed.

In view of the above circumstance, there has been proposed a method of forming a more micro photoresist pattern by performing a resist flow process on a photoresist pattern. The resist flow process refers to a process of forming a smaller photoresist pattern by applying thermal energy to raise the temperature of the photoresist above its glass transition temperature in order to shrink the pattern though thermal flow of the photoresist pattern.

FIG. 1A is a photograph showing a contact hole pattern on which the resist flow process was performed. FIG. 1B is a photograph showing a line pattern on which the resist flow process was performed. In particular, in FIGS. 1A and 1B, photographs located on the left of arrows indicate photoresist patterns before the resist flow process was performed, and photographs located on the right of the arrows indicate photoresist patterns after the resist flow process was performed.

As shown in FIG. 1A, the resist flow process is suitable to reduce the size of the contact hole pattern formed in the photoresist. However, as shown in FIG. 1B, the size of a line pattern formed in the photoresist is not shrunken even after the resist flow process, but the outline of the pattern has collapsed.

BRIEF SUMMARY OF THE INVENTION

The present invention can form a smaller line pattern when a resist flow process is performed by forming a photoresist pattern of line forms, which are formed in tandem as a plurality of contact hole patterns are overlapped.

A method of forming a pattern of a semiconductor device according to an embodiment of the present invention includes forming a photoresist film on a semiconductor substrate, performing an exposure process on a plurality of light transparent patterns arranged in tandem and the photoresist film corresponding between the light transparent patterns using a photomask including the light transparent patterns, and forming a photoresist pattern by performing a development process so that an opening portion of a line form is formed in the light transparent patterns and the photoresist film between the light transparent patterns.

The opening portion of the line form may be formed as a plurality of opening portions respectively having a circular section are overlapped with each other. The plurality of opening portions respectively having the circular section may have its radius overlapped by ⅓ to ⅔, resulting in the opening portion of the line form. The opening portion formed in the photoresist may be formed as the plurality of the opening portions respectively having an elliptical section are overlapped with each other. A resist flow process may be performed on the photoresist after the photoresist pattern is formed.

A method of forming a pattern of a semiconductor device according to another embodiment of the present invention includes providing a semiconductor substrate in which a plurality of word lines, and a drain select line and a source select line formed on both sides of the word lines are formed, forming an insulating layer over the word lines, the drain select line, and the source select line, forming a photoresist film on the insulating layer, performing an exposure process on a plurality of light transparent patterns arranged in tandem and the photoresist film corresponding between the light transparent patterns using a photomask including the light transparent patterns, and forming a photoresist pattern by performing a development process so that an opening portion of a line form is formed in the light transparent patterns and the photoresist film between the light transparent patterns.

The photoresist pattern may be formed between the source select lines. A resist flow process may be performed on the photoresist after the photoresist pattern is formed.

DESCRIPTION OF SPECIFIC EMBODIMENTS

A specific embodiment according to the present invention will be described with reference to the accompanying drawings.

However, the present invention is not limited to the disclosed embodiments, but may be implemented in various manners. The embodiment is provided to complete the disclosure of the present invention and to allow those having ordinary skill in the art to understand the scope of the present invention. The present invention is defined by the category of the claims.

Figure 1A:
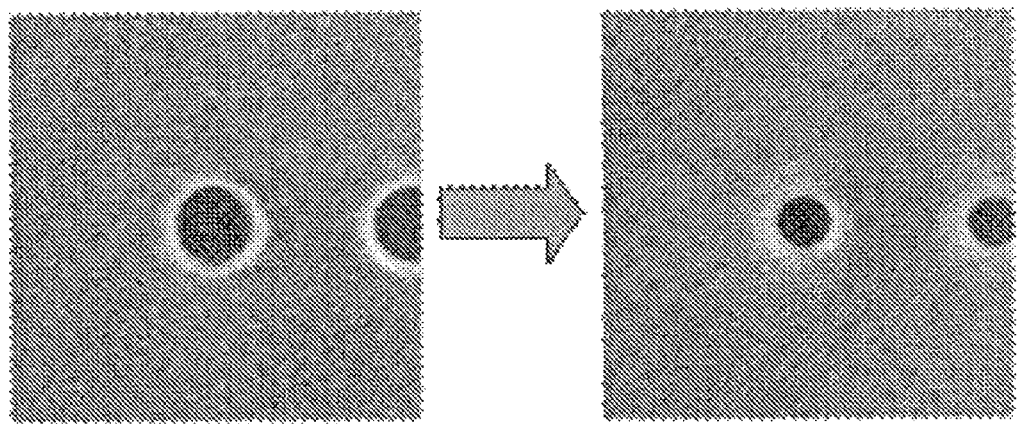
FIG. 1A is a photograph showing a contact hole pattern on which a resist flow process was performed.
Figure 1B:
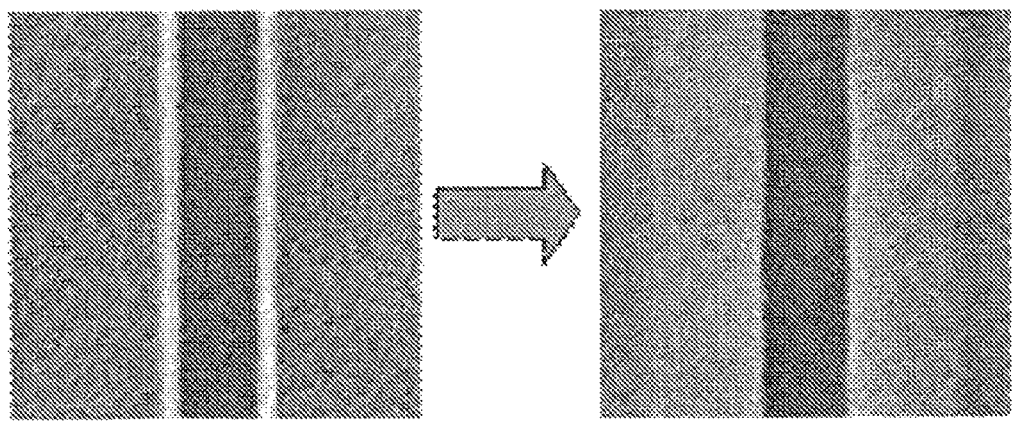
FIG. 1B is a photograph showing a line pattern on which a resist flow process was performed.
Figure 2:
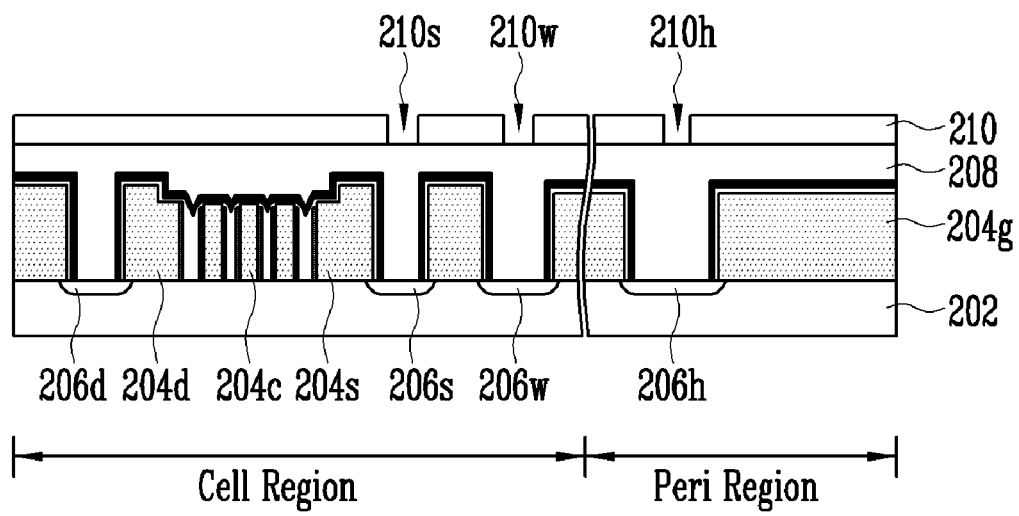
FIG. 2 is a sectional view illustrating a method of forming a pattern of a semiconductor device according to an embodiment of the present invention.

FIG. 2 is a sectional view illustrating a method of forming a pattern of a semiconductor device according to an embodiment of the present invention.

Referring to FIG. 2, a plurality of word lines 204c are formed in a cell region of a semiconductor substrate 202, and a drain select line 204d and a source select line 204s are formed on both sides of the word lines 204c through a typical process. The word lines 204c, the drain select line 204d, and the source select line 204s may be formed by patterning a stack layer consisting of a gate insulating layer, a charge storage layer, a dielectric layer, and a control gate layer. Alternatively, the drain select line 204d and the source select line 204s may be formed by removing part of the dielectric layer, or forming a contact plug and then connecting the charge storage layer and the control gate layer formed on upper and lower sides. Meanwhile, a gate line 204g for generating an operating voltage to the word lines 204c, the drain select line 204d, the source select line 204s, etc. formed in the cell region is formed in a peri region.

A plurality of junction regions 206d, 206s, 206w, and 206h are then formed in the cell region and the peri region by performing an ion implantation process on the exposed semiconductor substrate 202. In particular, the junction region 206d formed between the drain select lines 204d, of the junction regions formed in the cell region, is a drain region, and the junction region 206s formed between the source select lines 204s, of the junction regions formed in the cell region, is a common source region. The junction regions formed in the cell region also include a well pick-up region 206w to which a bias voltage is applied in such a manner that selected word lines 204c are erased by uniformly applying the bias voltage to the entire word lines 204c. A junction region (not shown) is also formed between the word lines 204c.

An insulating layer 208 is formed over the entire surface of the cell region and the peri region, including the word lines 204c, the drain select lines 204d, the source select lines 204s, and the gate line 204g. A photoresist pattern 210 is formed on the insulating layer 208. The photoresist pattern 210 includes a first opening 210s which corresponds to the source region in the cell region, a second opening 210w which corresponds to the well pick-up region in the cell region, and a third opening 210h which corresponds to the junction region 206h in the peri region. When the photoresist pattern 210 is viewed from a plan, the first opening 210s may be formed in a line form along the shape of the junction region 206s (i.e., the source region), and the second opening 210w and the third opening 210h may be formed in a contact hole form. A method of forming the photoresist pattern 210 is described in detail below.

Figure 3:
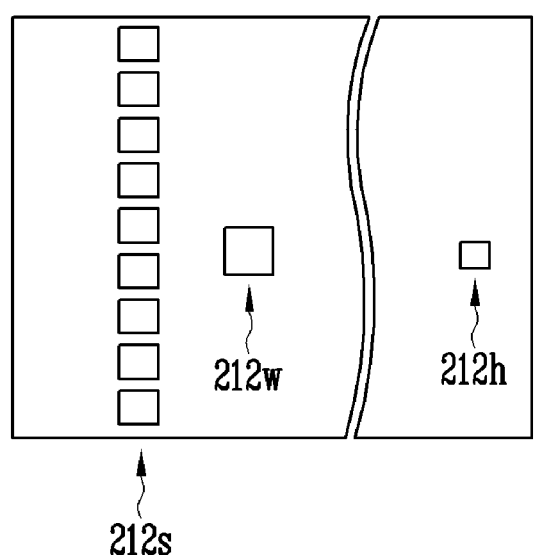
FIG. 3 is a plan view illustrating a photomask for forming a photoresist pattern according to an embodiment of the present invention.
Figure 4:
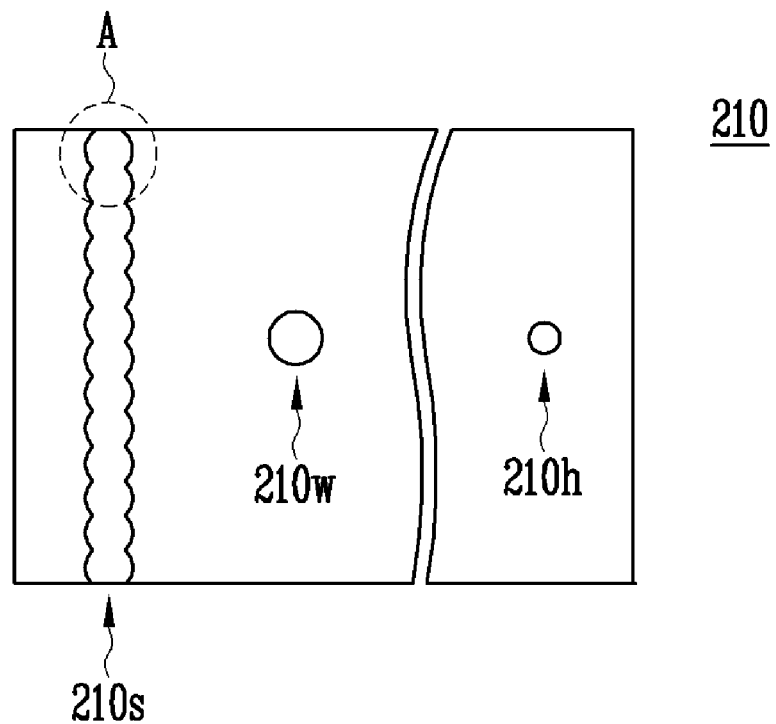
FIG. 4 is a plan view illustrating a photoresist pattern formed according to an embodiment of the present invention.
Figure 5:
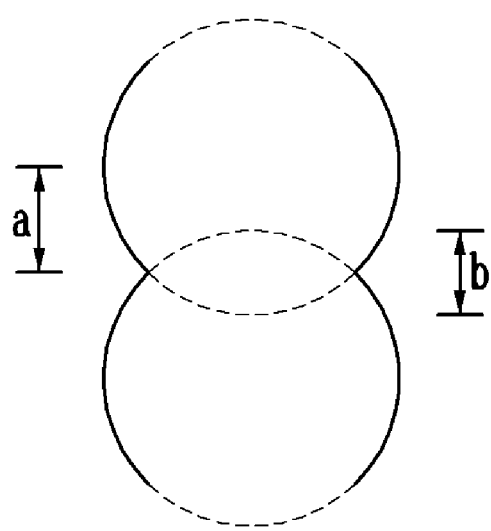
FIG. 5 is an enlarged view of section A of FIG. 4.
Figure 6:
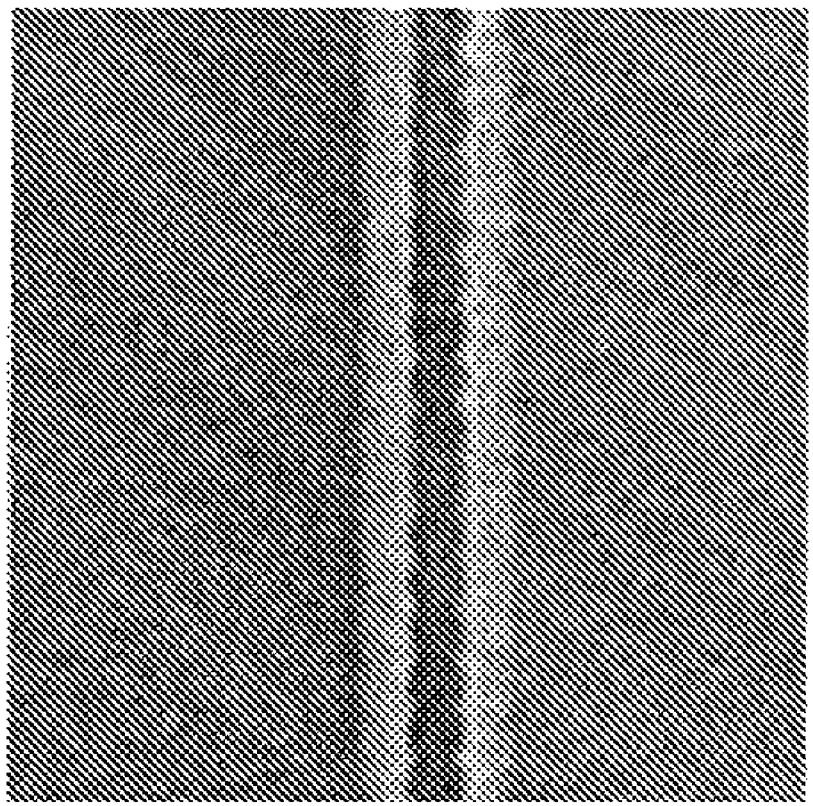
FIG. 6 is a photograph showing a photoresist pattern of a line fashion formed according to an embodiment of the present invention.

FIG. 3 is a plan view illustrating a photomask 212 for forming the photoresist pattern 210 according to an embodiment of the present invention. FIG. 4 is a plan view illustrating the photoresist pattern 210 formed according to an embodiment of the present invention. FIG. 5 is an enlarged view of a portion A of FIG. 4. FIG. 6 is a photograph showing the photoresist pattern 210 formed according to an embodiment of the present invention.

Referring to FIGS. 3 to 5, the photomask 212 used in the photolithography process for forming the photoresist pattern 210 includes a first pattern 212s corresponding to the first opening 210s of a line form, which is formed in the photoresist pattern 210, and a second pattern 212w and a third pattern 212h respectively corresponding to the second opening 210w and the third opening 210h of a contact hole form, which are formed in the photoresist pattern 210. In particular, the first pattern 212s has a plurality of squares arranged at predetermined intervals along a line. The first pattern 212s, the second pattern 212w, and the third pattern 212h are light transparent patterns on the photomask having non-light transparent patterns.

The photomask 212 (see FIG. 3) is provided between the photoresist film formed on the insulating layer (refer to 208 of FIG. 2) and an exposure light source, and a selective exposure process is then performed on the photoresist film. The photoresist pattern 210 is formed by performing a development process on the photoresist film after the exposure step. Thus, the patterns corresponding to the first patterns 212s are transferred to the photoresist film. Due to an interference and diffraction phenomenon of the light, these patterns transferred to the photoresist film define a continuous line. Accordingly, the plurality of squares needs to be spaced sufficiently close together, so that the patterns transferred to the photoresist film provide an overlap with adjacent patterns.

At this time, if exposure energy used in the exposure process is excessively stronger than typical exposure energy, the photoresist film corresponding between the first patterns 212s of the photomask 212 can be exposed and developed more easily. Therefore, the first openings 210s of the photoresist pattern 210 formed through the first patterns 212s of the photomask 212 have the plurality of contact hole patterns formed along a line and overlapped with each other at predetermined intervals. In other words, the first openings 210s are aligned in such a manner that the plurality of contact hole patterns, each having the shape of a circle whose radius is "a" is overlapped with an adjacent contact hole pattern by a distance (b). At this time, the first pattern 212s of the photomask 212 is formed such that the distance (b) is ⅓ to ⅔ of the radius (a).

If the plurality of contact hole patterns of the first openings 210s of the photoresist pattern 210 are too close to each other, the sidewalls on both sides of the first openings 210s becomes almost a straight line, which makes it difficult to shrink the pattern in a subsequent resist flow process. If the plurality of contact hole patterns constituting the first openings 210s of the photoresist pattern 210 are too far from each other, the contact hole patterns are not overlapped with each other and form independent contact holes, which makes it impossible to form a line pattern.

Meanwhile, the contact hole pattern of the first opening 210s may not have a circular section, but an elliptical section. Even in this case, the first patterns 212s of the photomask 212 are formed such that the distance (b) in which the plurality of contact hole patterns are overlapped with each other is ⅙ to ⅖ of a long or short axis of each contact hole pattern.

The resist flow process is then performed on the photoresist pattern 210 formed by the above process. Therefore, a smaller contact hole pattern can be formed through thermal flow in such a manner that the patterns of the second opening 210w and the third opening 210h, which have already been formed, have a reduced size, but maintain its shape. In particular, the first openings 210s in which the plurality of contact hole patterns are formed in tandem have their sizes reduced, so a uniform and smaller pattern can be obtained as shown in FIG. 6.

Thereafter, though not shown in the drawings, contact holes are formed by etching the insulating layer 208 using the photoresist pattern 210. The contact holes are gap filled with a conductive material, thus forming a plurality of contact plugs.

As described above, in accordance with the method of forming a pattern of a semiconductor device according to the present invention, the photoresist pattern of a line form in which a plurality of contact hole patterns are formed in tandem while they are overlapped with each other is formed. Thus, when a resist flow process is performed, a smaller photoresist pattern of a line form can be formed. Accordingly, semiconductor devices with higher integration and further improved performance can be fabricated.

What is claimed is:

1. A method of forming a pattern of a semiconductor device method, the method comprising:
   forming a photoresist film over a semiconductor substrate;
   performing an exposure process on the photoresist film using a photomask having a plurality of light transparent patterns arranged in a line, thereby forming exposure portions in the photoresist film corresponding to the light transparent patterns of the photomask, wherein each of the exposure portions has a radius X and the exposure portions overlap each other due to an interference and diffraction phenomenon of light;
   performing a development process so that an opening pattern of a continuous line is formed on the photoresist film; and
   performing a resist flow process to shrink a size of the opening pattern,
   wherein each of the exposure portions overlaps the adjacent exposure portion by (⅓)X to (⅔)X.

2. The method of claim 1, wherein the opening pattern of the continuous line is obtained from a plurality of opening portions corresponding to the exposure portions that overlap with each other.

3. The method of claim 1, wherein each of the exposure portions has a circular shape having the radius X.

4. The method of claim 1, wherein each of the exposure portions has an elliptical shape having a long axis and a short axis, wherein the radius X is a radius of a long or short axis.

5. A method of forming a pattern of a semiconductor device method, the method comprising:
   providing a semiconductor substrate in which a plurality of word lines, and a drain select line and a source select line are formed;
   forming an insulating layer over the word lines, the drain select line, and the source select line;
   forming a photoresist film over the insulating layer;
   performing an exposure process on the photoresist film using a photomask having a plurality of light transparent patterns arranged in a line, thereby forming exposure portions in the photoresist film corresponding to the light transparent patterns of the photomask, wherein each of the exposure portions has a radius X and the exposure portions overlap each other due to an interference and diffraction phenomenon of light;
   performing a development process to remove the exposure portions so that an opening pattern of a continuous line is formed in the photoresist film; and
   performing a resist flow process to shrink a size of the opening pattern,
   wherein each of the exposure portions overlaps the adjacent exposure portion by (⅓)X to (⅔)X.

6. The method of claim 5, wherein the opening pattern is formed between the source select lines.

* * * * *